US012777879B2

(12) United States Patent
Yazawa et al.

(10) Patent No.: US 12,777,879 B2
(45) Date of Patent: Oct. 27, 2026

(54) SUBSTRATE PROCESSING APPARATUS

(71) Applicant: EBARA CORPORATION, Tokyo (JP)

(72) Inventors: Akihiro Yazawa, Tokyo (JP); Hirotaka Ohashi, Tokyo (JP); Yasuyuki Miyasawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 349 days.

(21) Appl. No.: 18/704,865

(22) PCT Filed: Oct. 11, 2022

(86) PCT No.: PCT/JP2022/037848
§ 371 (c)(1),
(2) Date: Apr. 25, 2024

(87) PCT Pub. No.: WO2023/084977
PCT Pub. Date: May 19, 2023

(65) Prior Publication Data

US 2025/0259867 A1 Aug. 14, 2025

(30) Foreign Application Priority Data

Nov. 10, 2021 (JP) ................................ 2021-183078

(51) Int. Cl.
*H10P 72/00* (2026.01)
*H10P 72/30* (2026.01)

(52) U.S. Cl.
CPC ...... *H10P 72/0472* (2026.01); *H10P 72/0404* (2026.01); *H10P 72/0428* (2026.01); *H10P 72/0606* (2026.01); *H10P 72/3202* (2026.01)

(58) Field of Classification Search
CPC ............. H10P 72/0472; H10P 72/0404; H10P 72/0428; H10P 72/0606; H10P 72/3202;
(Continued)

(56) References Cited

U.S. PATENT DOCUMENTS 6,221,781 B1 * 4/2001 Siefering ............ H10P 72/0404
156/345.55
6,595,831 B1 * 7/2003 Hirokawa ................. B08B 1/36
451/63

(Continued)

FOREIGN PATENT DOCUMENTS

JP 2015-082570 A 4/2015
JP 2018-026461 A 2/2018

(Continued)

OTHER PUBLICATIONS

International Patent Application No. PCT/JP2022/037848; Int'l Search Report dated Dec. 6, 2022; 4 pages.

*Primary Examiner* — Patrick C Williams
(74) *Attorney, Agent, or Firm* — BakerHostetler

(57) ABSTRACT

The present invention relates to a substrate processing apparatus for processing a substrate. The substrate processing apparatus (10) at least one first processing module (21*a*, 21*b*) configured to process a substrate W using a liquid; at least one second processing module (31) configured to process the substrate W that has been processed by the first processing module (21*a*, 21*b*); a transfer robot (22) which is placed in a transfer area (28) for transferring the substrate W from the first processing module (21*a*, 21*b*) to the second processing module (31); a pair of gutters (53, 54) which are disposed above a floor (51) provided in the transfer area (28) and coupled to drain lines (58, 58); and at least one inclined plate (56) which is hung over the pair of gutters (53, 54). An upper surface of the inclined plate (56) extends from one of the pair of gutters (53, 54) to the other at an angle with respect to a horizontal direction.

7 Claims, 5 Drawing Sheets

(58) Field of Classification Search
CPC .. H10P 72/30; H10P 72/0412; H10P 72/0456; H10P 72/0464; H10P 52/00
See application file for complete search history.

(56) References Cited

U.S. PATENT DOCUMENTS

| | | | | |
|---|---|---|---|---|
| 2002/0050322 | A1* | 5/2002 | Kunisawa | H10P 72/78 156/345.11 |
| 2006/0219258 | A1* | 10/2006 | Gast | H10P 70/234 257/E21.228 |
| 2017/0207106 | A1* | 7/2017 | Xu | H10P 72/0404 |
| 2023/0364740 | A1* | 11/2023 | Kodama | B24B 57/02 |

FOREIGN PATENT DOCUMENTS

| | | | |
|---|---|---|---|
| JP | 2018-190898 | A | 11/2018 |
| JP | 2020-188238 | A | 11/2020 |

* cited by examiner

SUBSTRATE PROCESSING APPARATUS

TECHNICAL FIELD

The present invention relates to a substrate processing apparatus for processing a substrate, such as a wafer.

BACKGROUND ART

As one of substrate processing apparatuses for processing a substrate, such as a wafer, a polishing apparatus is widely known. A polishing apparatus generally includes a polishing module for polishing a substrate, a cleaning module for cleaning the polished substrate, and a drying module for drying the cleaned substrate. The polishing apparatus further has a transfer robot for transferring the substrate between each of the modules (see, patent document 1, for example).

When a substrate is processed in the polishing module, the substrate is made wet with liquid (e.g., polishing liquid and pure water). Accordingly, when the transfer robot transfers the polished substrate from the polishing module to the cleaning module, liquid adhered to the substrate falls down at a transfer area where the transfer robot is disposed.

On the other hand, a floor is provided in the transfer area for workers who perform adjustments and maintenances of equipment placed in the polishing apparatus, including the transfer robot described above. The workers can move on the floor to access the equipment to be adjusted and maintained. This floor is provided above a base of the polishing apparatus, and there are typically utilities, such as wires, signal cables, and pipes, disposed between the floor and the base. Therefore, in order to prevent liquid, which fall down from the substrate, from causing contamination or failure of the utilities mentioned above, there is a water-receiving pan above the floor, which is made of a plurality of panels.

CITATION LIST

Patent Literature

Patent document 1: Japanese laid-open patent publication No. 2018-190898

SUMMARY OF INVENTION

Technical Problem

A conventional water-receiving pan has a labyrinth structure provided between partitions, which separate each of the modules from the transfer area, and the panels in order to securely prevent liquid from reaching the floor and the utilities disposed below the floor.

On the other hand, when the workers enter the polishing apparatus for operations such as maintenance, the workers need to remove the water-receiving pan from the polishing apparatus to expose the floor. However, in order to remove the water-receiving pan, the labyrinth structure mentioned above requires to be disassembled, and this operation may be laborious. Further, after completing operations such as maintenance, the worker needs to reassemble the water-receiving pan including the labyrinth structure, and this reassembly operation may also be laborious. Time taken to remove and reassemble the water-receiving pan causes an increase in downtime for the polishing apparatus.

The issues mentioned above occur similarly in any type of substrate processing apparatuses that transfer the wetted substrate using transfer robot. For example, the same issues occur in substrate processing apparatus equipped with a plating apparatus, a grinding apparatus, a photoresist-film coating apparatus, an etching apparatus, and so on.

Therefore, it is an object of the present invention to provide a substrate processing apparatus having a liquid-proof structure capable of preventing liquid from intruding into a floor, and further capable of performing attach and detach operation easily.

Solution to Problem

In one embodiment, there is provided a substrate processing apparatus, comprising: at least one first processing module configured to process a substrate using a liquid: at least one second processing module configured to process the substrate that has been processed by the first processing module: a transfer robot which is placed in a transfer area for transferring the substrate from the first processing module to the second processing module: a pair of gutters which are disposed above a floor provided in the transfer area and coupled to drain lines; and at least one inclined plate which is hung over the pair of gutters, wherein an upper surface of the inclined plate extends from one of the pair of gutters to the other at an angle with respect to a horizontal direction.

In one embodiment, at least a lower end of a partition wall for dividing the first processing module from the transfer area is located above one of the pair of gutters.

In one embodiment, at least a lower end of a partition wall for dividing the second processing module from the transfer area is located above the other of the pair of gutters.

In one embodiment, the substrate processing apparatus further comprises: a sensor configured to detect whether or not the inclined plate is positioned correctly with respect to the pair of gutters.

In one embodiment, the inclined plate has a sensor dog attached to a lower surface thereof, and the sensor is a non-contact type detection-sensor or a contact type detection-sensor configured to detect the sensor dog.

In one embodiment, the at least one inclined plate comprises a plurality of inclined plates which are arranged along a longitudinal direction of the substrate processing apparatus, and the plurality of inclined plates are continuously arranged in the longitudinal direction of the substrate processing apparatus by overlapping front and rear ends of adjacent inclined plates in the longitudinal direction.

In one embodiment, the substrate processing apparatus further comprises: a door which is provided in a wall of the substrate processing apparatus and for access to the transfer area, wherein the transfer area extends from the door along a longitudinal direction of the substrate processing apparatus, and in a straight line.

Advantageous Effects of Invention

According to the present invention, since the inclined plate is hung over the pair of gutters, liquid falling down from the substrate flows along the inclined plate and flows into the gutters. As a result, liquid is prevented from reaching the floor. Further, simply lifting the inclined plate that is hung over the pair of gutters enables the floor to be exposed, whereas simply placing the inclined plate on the pair of gutters enables the liquid-proof structure to be easily reassembled.

DESCRIPTION OF EMBODIMENTS

Figure 1:
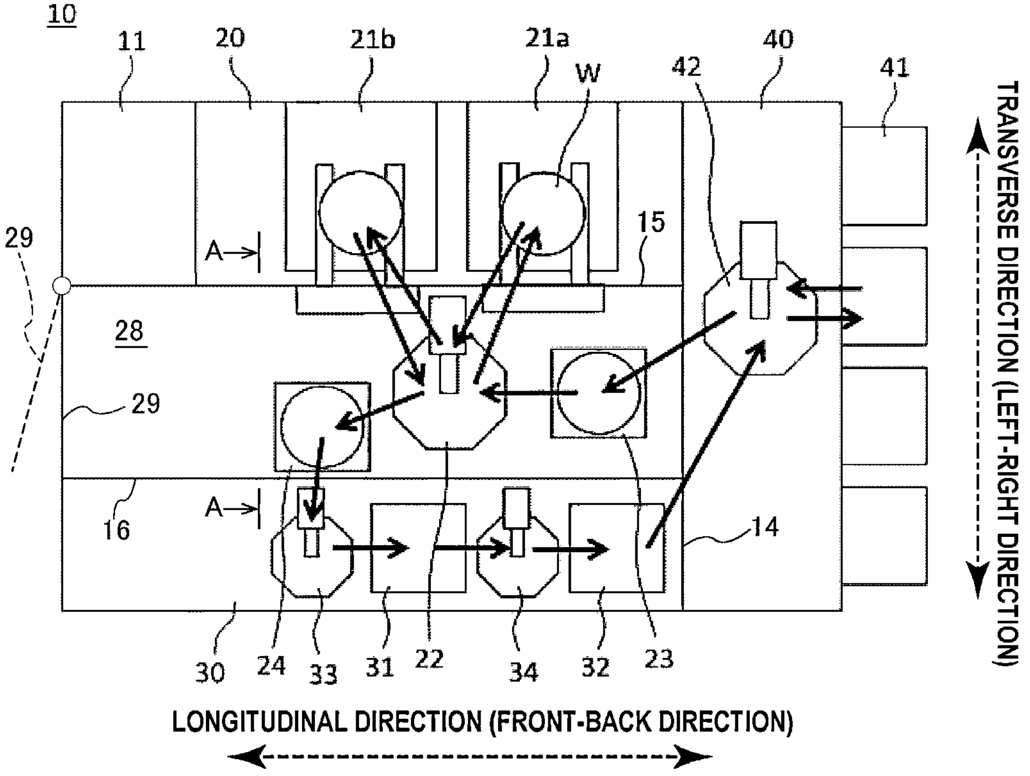
FIG. 1 is a plan view showing a whole configuration of a substrate processing apparatus according to one embodiment.

Embodiments according to the present invention will be described below with reference to the drawings.

Identical or corresponding components are denoted by identical reference numerals, and will not be described in duplication.

FIG. 1 is a plan view showing a whole configuration of a substrate processing apparatus according to one embodiment. Arrows in FIG. 1 indicate a direction in which a wafer W is transferred, the wafer being an example of a substrate.

As shown in FIG. 1, the substrate processing apparatus 10 has a housing in a substantially rectangular-form, and an interior space of the housing is divided into a polishing section 20, a cleaning section 30, and a loading/unloading section 40 by partition walls 14, 15, and 16. The polishing section 20, the cleaning section 30, and the loading/unloading section 40 are assembled independently of each other, and exhausted independently of each other. Further, a controller 11 is provided in the substrate processing apparatus 10, which is configured to control operations of the polishing section 20, the cleaning section 30, and the loading/unloading section 40.

As shown in FIG. 1, the load/unload section 40 has a plurality (four in the illustrated example) of front loaders 41 arranged next to each other at the front of the load/unload section 40, and a first transfer robot 42 that can move along an arrangement direction of the front loaders 41.

A wafer cassette configured to store a large number of wafers W is placed on each of the front loaders 41. Specifically, each of the front loaders 41 can receive thereon an open cassette, a SMIF (Standard Manufacturing Interface) pod, or a FOUP (Front Opening Unified Pod), for example. The SMIF and the FOUP are a hermetically sealed container, respectively, which houses a wafer cassette therein and is covered with a partition wall to provide an interior environment isolated from an external space.

The first transfer robot 42 can move along the arrangement direction of the front loaders 41 to access the wafer cassettes mounted on each front loader 41. This first transfer robot 42 has two hands (not shown) on upper and lower sides. For example, the upper hand is used to return the wafer W to the wafer cassette, and the lower hand is used to transfer the wafer W before polishing, allowing the upper and lower hands to be used in different ways.

The polishing section 20 shown in FIG. 1 corresponds to an area where the polishing process of the wafer W is performed, and has at least one (two in the illustrated example) polishing module 21*a*, 21*b*, a first temporary stage 23 on which the wafer W before polishing is temporarily placed, a second temporary stage 24 on which the wafer W after polishing is temporarily placed, and a second transfer robot 22 configured to transfer the wafer W between the polishing modules 21*a*, 21*b*, the first temporary stage 23, and the second temporary stage 24.

In this embodiment, each of the polishing modules 21*a*, 21*b* is a polishing module configured to polish a peripheral portion (also referred to as a bevel portion) of the substrate by sliding a polishing tool into contact with the peripheral portion in the presence of a liquid, such as pure water and a chemical liquid. Each of the polishing modules 21*a*, 21*b* corresponds to a first processing module configured to process the wafer W (substrate) using liquid. In one embodiment, the polishing module as the first processing module may be a CMP module in which the substrate is pressed against a rotating polishing pad in the presence of a liquid, such as a slurry, to thereby polish a surface of the substrate, or may be a back-surface polishing module in which a polishing tool is slid into contact with a back surface of the substrate to thereby polish the back surface.

Hereinafter, the polishing module will be described as an example of the first processing module. However, the processing module is not limited to this example as long as liquid is used to process the substrate (e.g., processing liquid). For example, the first processing module may be other module, such as a plating module, a grinding module, a photoresist-film coating module, or an etching module.

The cleaning section 30 corresponds to an area where the wafer W after polishing is cleaned and further dried, and has a cleaning module 31, a drying module 32, a third transfer robot 33, and a fourth transfer robot 34. In this embodiment, the cleaning module 31 corresponds to a second processing module configured to process the wafer W that have been processed in the polishing module 21*a* or 21*b* serving as the first processing module.

The third transfer robot 33 is placed between the second temporary stage 24 of the polishing section 20 and the cleaning module 31, and transfers the wafer W after polishing from the second temporary stage 24 to the cleaning module 31. The fourth transfer robot 34 is placed between the cleaning module 31 and the drying module 32, and transfers the wafer W after cleaning from the cleaning module 31 to the drying module 32.

The cleaning module 31 may be a roll-type cleaning module which rotates and presses upper and lower roll-shaped sponges, which are vertically arranged, against front and rear surfaces of the substrate to clean the front and rear surfaces of the substrate, or may be a pencil-type cleaning module which rotates and presses a hemispherical sponge against the substrate to clean the substrate. The drying module 32 can be, for example, a spin-dry type drying module which has a stage configured to rotate the substrate W chucked at high speed, and which enables the substrate W after cleaning to be dried by rotating the substrate W at high speed.

As shown in FIG. 1, the partition wall 14 serves as a dividing wall that separates the polishing section 20 and the cleaning section 30 from the loading/unloading section 40. Between the partition wall 15 for dividing the polishing section 20 and the partition wall 16 for dividing the cleaning section 30, a transfer area 28 is formed, where the second transfer robot 22 is disposed. The wafer W that has been polished in the polishing modules 21*a* or 21*b* of the polishing section 20 is transferred through the transfer area 28 to the cleaning module 31 of the cleaning section 30.

Next, an example of a substrate processing method in the substrate processing apparatus 10 having such configuration will be described.

As shown in FIG. 1, at first, in the load/unload section 40, the first transfer robot 42 removes the wafer W before polishing from the wafer cassette placed in the front loader 41, and temporarily places the wafer W on the first temporary stage 23.

The second transfer robot 22 clamps the wafer W before polishing on the first temporary stage 23 with the hand thereof, and then carries the wafer W into the first polishing module 21*a* (or the second polishing module 21*b*). The first polishing module 21*a* (or second polishing module 21*b*) then performs a polishing process on the carried-into wafer W.

Next, after the polishing process of the wafer W in the first polishing module 21*a* (or second polishing module 21*b*) is completed, the second transfer robot 22 removes the wafer W after polishing from the first polishing module 21*a* (or second polishing module 21*b*), and temporarily places the wafer W on the second temporary stage 24.

After the wafer W after polishing is temporarily placed on the second temporary stage 24, the third transfer robot 33 transfers the wafer W after polishing from the second temporary stage 24 to the cleaning module 31, and then the cleaning module 31 performs the cleaning process of the wafer W. Next, the fourth transfer robot 34 transfers the wafer W after cleaning from the cleaning module 31 to the drying module 32, and then the drying module 32 performs the drying process of the wafer W. Thereafter, the first transfer robot 42 of the load/unload section 40 removes the wafer W after drying from the drying module 32, and stores the wafer W into the wafer cassette placed in the front loader 41.

The wafer W polished in the polishing module 21*a* or 21*b* is transferred to the cleaning module 31 by use of the second transfer robot 22. At this time, since the wafer W is wet with processing liquid (i.e., liquid) such as pure water, the liquid may fall down from the wafer W in the transfer area 28 where the second transfer robot 22 is disposed. Accordingly, a liquid-proof structure is provided in the lower portion of the transfer area 28 to catch the liquid that falls down from the wafer W. Hereinafter, the liquid-proof structure according to the present embodiment will be described.

In this specification, a direction of arrow indicated by a dotted line in FIG. 1 is referred to as a "longitudinal direction" or a "front-back direction," and a direction of arrow indicated by a single-dotted line in FIG. 1 is referred to as a "transverse direction" or a "left-right direction". The transverse direction is orthogonal to the longitudinal direction in the horizontal view.

Figure 2:
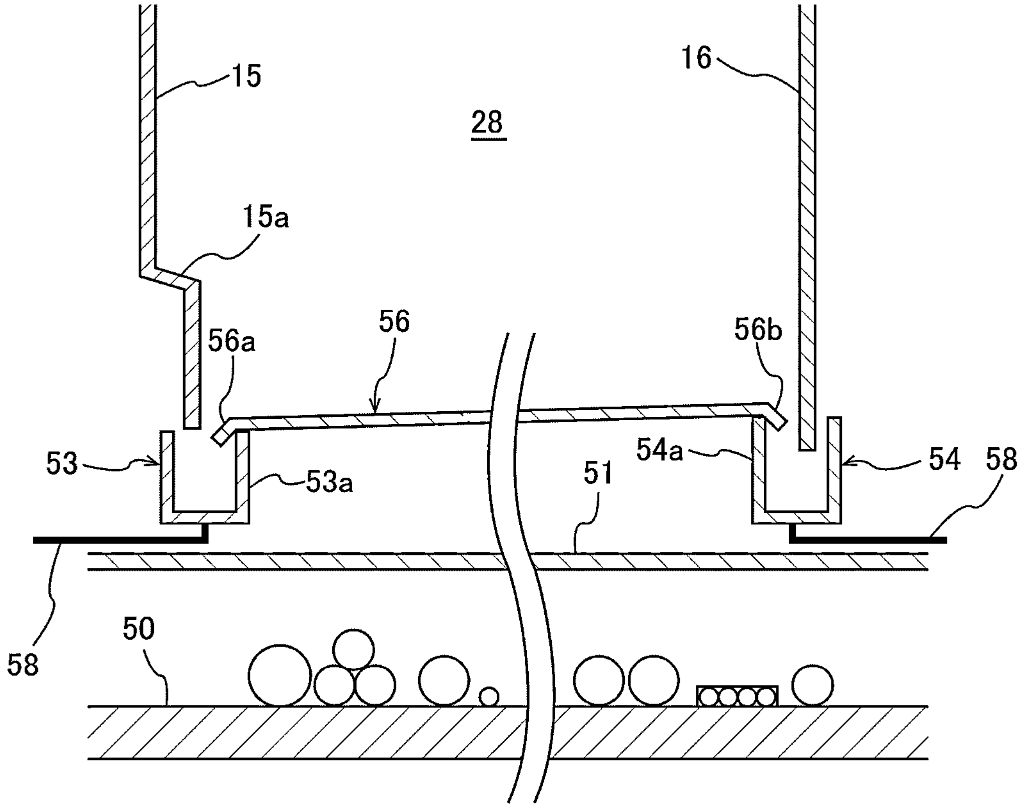
FIG. 2 is a cross-sectional view schematically showing a lower portion of the substrate processing apparatus taken along line A-A in FIG. 1.

FIG. 2 is a cross-sectional view schematically showing a lower portion of the substrate processing apparatus taken along line A-A in FIG. 1. FIG. 2 corresponds to a cross-sectional view showing a liquid-proof structure provided in the lower portion of the transfer area 28. As shown in FIG. 2, the substrate processing apparatus 10 has a base 50 for supporting the substrate processing apparatus 10 in its entirety, and a floor 51 is disposed above the base 50 in the transfer area 28. The floor 51 is provided for workers to enter the substrate processing apparatus 10, and is, for example, supported on the base 50 or a frame of the substrate processing apparatus 10 by a plurality of support platforms (not shown). Between the base 50 and the floor 51, utilities of the substrate processing apparatus 10, such as wires, signal lines, and pipes, are arranged. The liquid-proof structure is provided to prevent liquid falling down from the wafer W from passing through the floor 51 and reaching the utilities.

The liquid-proof structure shown in FIG. 2 has a pair of gutters 53, 54 provided above the floor 51 and adjacent to the partition walls 15, 16 mentioned above, respectively, and at least one inclined plate 56 hung over the pair of gutters 53, 54. The inclined plate 56 is a plate having a substantially flat shape, and ends 56*a*, 56*b* of the inclined plate 56 in the left and right directions (see FIG. 1) are bent downwards. When the inclined plate 56 is hung over the pair of gutters 53, 54, the ends 56*a*, 56*b* of the inclined plate 56 in the left-right direction are located within openings of the gutters 53, 54, respectively. In other words, the inclined plate 56 is placed on the pair of gutters 53, 54 such that the ends 56*a*, 56*b* of the inclined plate 56 in the left-right direction are located within the openings of the gutters 53, 54.

The pair of gutters 53, 54 are secured to the frame, which is not shown in the drawings, of the substrate processing apparatus 10. Each of the gutters 53, 54 has an upwardly opened and U-shaped cross-section, and the gutters 53, 54 are coupled to drains 58, 58, respectively. The inclined plate 56 is hung over an inner wall 53*a* of the gutter 53 and an inner wall 54*a* of the gutter 54.

One gutter 53 is provided below the partition wall 15, and a lower end of the partition wall 15 is opposite to the opening of the gutter 53. Similarly, the other gutter 54 is provided below the partition wall 16, and a lower end of the partition wall 16 is opposite to the opening of the gutter 54. As shown in FIG. 2, the lower end of the partition wall 15 may be located above the gutter 53, or the lower end of the partition wall 16 may extend into the interior space of the gutter 54. Although not shown, the lower end of the partition wall 15 may extend into the interior space of the gutter 53, and the lower end of the partition wall 16 may be located above the gutter 54. In one embodiment, the lower end of the partition wall 15 may be coupled to an outer wall of the gutter 53, or the partition wall 15 and the outer wall of the gutter 53 may be made integrally. Similarly, the lower end of the partition wall 16 may be coupled to an outer wall of the gutter 54, or the partition wall 16 and the outer wall of the gutter 54 may be made integrally.

The lower end of the partition wall 15 shown in FIG. 2 is formed as a bent portion 15*a* which is directed toward the opening of the gutter 53. The bent portion 15*a* serves as a guide portion for guiding liquid, which has flown down along the partition wall 15, toward the gutter 53. In this case, as long as the lower end of the bent portion 15*a* is opposite to the opening of the gutter 53, no part of the partition wall 15 other than the bent portion 15*a* needs to be located above the gutter 53. In this manner, the partition wall 15 may have the bent portion 15*a* formed in the lower end thereof, which guides liquid toward the opening of the gutter 53. Similarly, the partition wall 16 may have a bent portion formed in the lower end thereof, which guides liquid toward the opening of the gutter 54.

With this configuration, liquid that scatters from the wetted wafer W and adheres to the partition walls 15, 16 when the wafer W is transferred by the second transfer robot 22, flows along the partition walls 15, 16 and into the gutters 53, 54.

The inclined plate 56, which has a substantially flat shape and is hung over the pair of gutters 53, 54, is inclined at a constant angle with respect to a horizontal plane from one gutter 54 toward the other gutter 53. In this embodiment, an upper end of the gutter 54 is higher than an upper end of the gutter 53 as viewed in a vertical direction, and thus when the inclined plate 56 is placed on the upper ends of the inner walls 53*a*, 54*a* of the gutters 53, 54, the inclined plate 56 is hung over the gutters 53, 54 obliquely with respect to the horizontal direction. As a result, most of liquid falling down from the wafer W flows from the inclined plate 56 toward one gutter 53, and is collected in the gutter 53. The remaining (i.e., a part) of the liquid that falls from the wafer W is collected in the other gutter 54. The liquid collected in the gutters 53 and 54 in this manner is discharged from the substrate processing apparatus 10 through the drains 58, 58 coupled to the pair of gutters 53 and 54. This liquid-proof structure prevents liquid falling down from the wafer W from reaching the floor 51.

Further, when worker intends to enter the substrate processing apparatus 10, only a simple operation of lifting the inclined plates 56 from the gutters 53, 54 enables the worker to expose the floor 51. As a result, the worker can expose the floor 51 in a short time, allowing easy entry into the substrate processing apparatus 10. After a work has been completed, the inclined plates 56 can be hung over the gutters 53, 54, and thus the liquid-proof structure described above can be easily reassembled. Thus, downtime of the substrate processing apparatus 10 can be decreased.

Figure 3A:
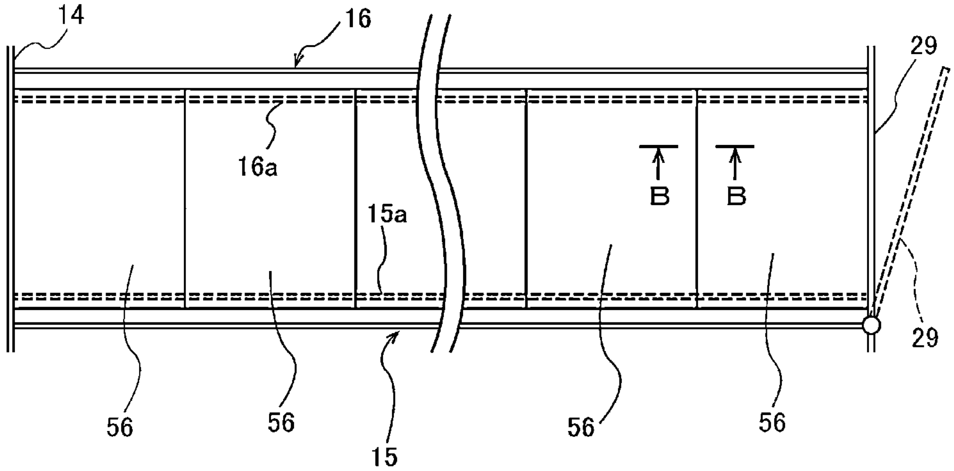
FIG. 3A is a top view showing a liquid-proof structure according to one embodiment.
Figure 3B:
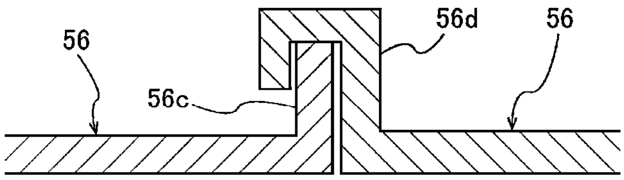
FIG. 3B is a cross-sectional view taken along line B-B in FIG. 3A.

FIG. 3A is a top view showing the liquid-proof structure according to one embodiment, and FIG. 3B is a cross-sectional view taken along line B-B in FIG. 3A. FIG. 3B represents a schematic view to illustrate a method of coupling adjacent inclined plates 56 to each other.

The liquid-proof structure shown in FIG. 3A has a plurality of inclined plates 56. The plurality of inclined plates 56 are continuously arranged in the longitudinal direction (see FIG. 1) by overlapping a front end 56*c* and a rear end 56*d* in the adjacent inclined plates 56 in the longitudinal direction. As shown in FIG. 3B, the inclined plate 56 has the rear end in which a protruding portion 56*c* extending upward is formed, and has the front end in which a covering portion 56*d* is formed so as to cover the protruding portion 56*c* from above. When the plurality of inclined plates 56 are arranged continuously in the longitudinal direction, the ends 56*a*, 56*b* of the inclined plates 56 in the left-right direction are placed on the inner walls 53*a*, 54*a* of the gutter 53, 54, respectively, and further the protruding portion 56*c* formed to the rear end of one of the adjacent inclined plates 56 is covered by the covering portion 56*d* formed to the front end of the other inclined plate 56. This configuration prevents liquid falling down from the wafer W from reaching the floor 51 through a gap in the front-back direction formed between the adjacent inclined plates 56.

Moreover, one of the inclined plates 56 can be easily lifted from the other inclined plate 56, and thus the plurality of inclined plates 56 can be easily removed. When reassembling the plurality of inclined plates 56, the covering portion 56*d* in one of the inclined plates 56 is simply placed over the protruding portion 56*c* in the other inclined plate 56 in accordance with the order of longitudinal arrangement. In this manner, the plurality of inclined plates 56 can be easily removed and reassembled, and thus downtime of the substrate processing apparatus can be decreased.

In this embodiment, the floor 51 can be exposed or covered by simple operations, such as hanging the inclined plates 56 over the pair of gutters 53, 54, or removing the inclined plates 56 from the pair of gutters 53, 54. On the other hand, if the inclined plates 56 are not positioned correctly with respect to the pair of gutters 53, 54, there is a risk that liquid falling down from the wafer W may reach the floor 51. Therefore, the substrate processing apparatus 10 preferably has a sensor to detect whether or not the inclined plates 56 are correctly positioned with respect to the pair of gutters 53, 54.

Figure 4A:
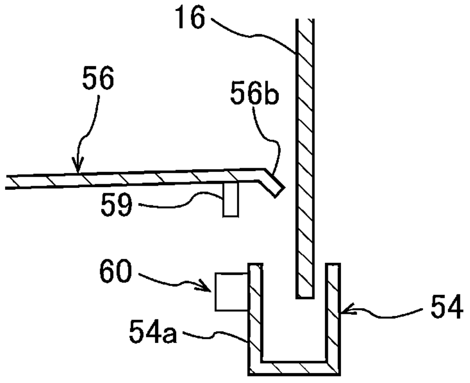
FIG. 4A is a side view schematically showing an example of a sensor for detecting whether or not an inclined plate is correctly positioned with respect to a pair of gutters.
Figure 4B:
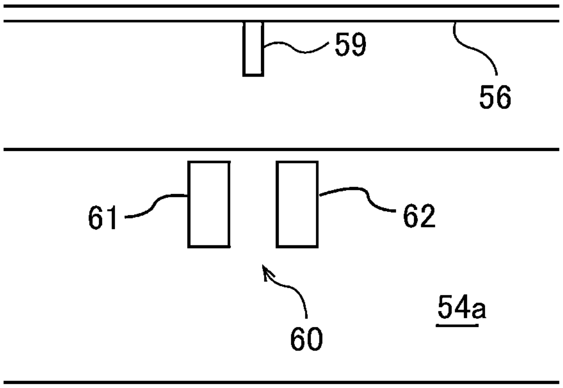
FIG. 4B is a front view schematically showing the sensor shown in FIG. 4A.
Figure 4C:
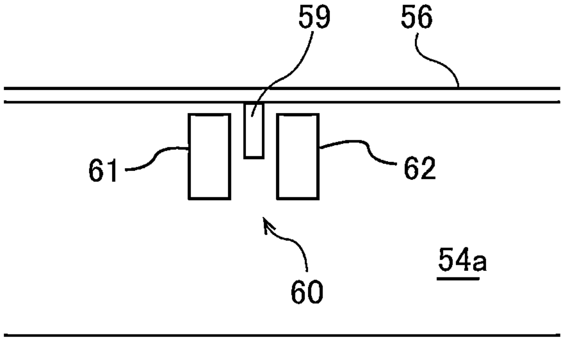
FIG. 4C is a schematic view showing a state in which the sensor shown in FIG. 4B is operating properly.

FIG. 4A is a side view schematically showing an example of a sensor for detecting whether or not the inclined plate is correctly positioned with respect to the pair of gutters: FIG. 4B is a front view schematically showing the sensor shown in FIG. 4A: and FIG. 4C is a schematic view showing a state in which the sensor shown in FIG. 4B is operating properly.

The sensor 60 shown in FIGS. 4A and 4B is an optical sensor having a light emitter 61 and a light receiver 62. The sensor 60 is coupled to the controller 11 (see FIG. 1) mentioned above, and is configured to transmit measurement results thereof to the controller 11. In this embodiment, the light emitter 61 and the light receiver 62 are attached to an outer surface of the inner wall 54*a* of the gutter 54, and the light receiver 62 is arranged in close proximity to the light emitter 61 so as to be able to receive light emitted from the light emitter 61.

On the other hand, the inclined plate has a lower surface to which a sensor dog 59 is mounted. The sensor dog 59 is inserted into a gap formed between the light emitter 61 and the light receiver 62 when the inclined plate 56 is placed in the correct position with respect to the pair of gutters 53, 54. This action interrupts the light-receiving signal sent from the sensor 60 to the controller 11. The controller 11 determines that the inclined plate 56 is positioned correctly with respect to the pair of gutters 53, 54 when no light-receiving signal is sent from the sensor 60. In this embodiment, the sensor dog 59 and the sensor 60 constitute a position detection mechanism for the inclined plate 56.

Any type of the position detection mechanism can be used freely as long as the position detection mechanism can detect whether or not the inclined plate 56 is attached in the correct position with respect to the pair of gutters 53, 54. For example, the sensor 60 may be a non-contact type detection-sensor, such as the optical sensor described above, as well as a contact type detection-sensor, such as a touch sensor capable of detecting a contact with the sensor dog 59. Examples of the non-contact type sensors other than the optical sensor may include an ultrasonic sensor, which has a transmitter to emit ultrasonic waves and a receiver to receive the ultrasonic waves emitted from the transmitter, and a magnetic sensor.

As shown in FIGS. 1 and 3A, the transfer area 28 is preferably formed along the longitudinal direction of the substrate processing apparatus 10, and in a straight line as viewed in a plan. For example, the transfer area 28 extends in a straight line from an external surface of the substrate processing apparatus 10 to the partition wall 14. In this case, the pair of gutters 53, 54 can also be arranged in a straight line extending along the longitudinal direction of the substrate processing apparatus 10, and the inclined plate 56 can also have a rectangular shape substantially.

Further, it is preferable to provide a door 29 in the wall (external wall) of the substrate processing apparatus 10 that allows access to the transfer area 28. In this case, the workers can easily perform any work, such as maintenance of the substrate processing apparatus 10, and furthermore components of the substrate processing apparatus 10, such as the second transfer robot 22, can be easily taken out of the substrate processing apparatus 10.

Figure 5A:
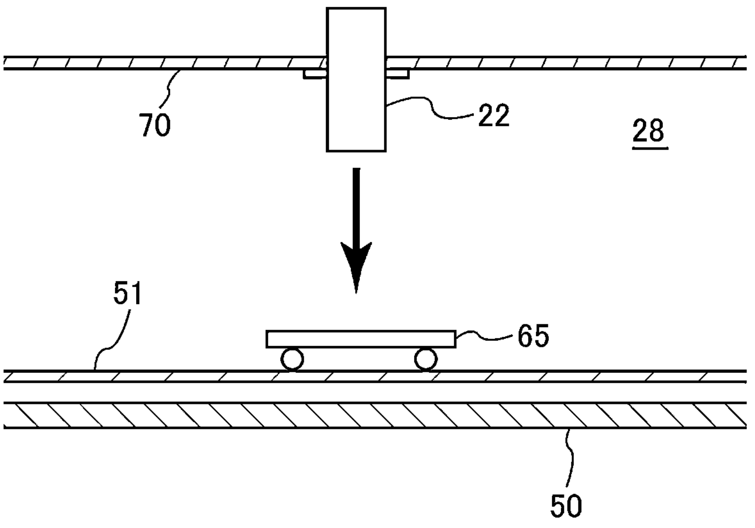
FIG. 5A is a schematic view showing a state in which a cart for taking a second transfer robot out of the substrate processing apparatus has been carried into a transfer area.
Figure 5B:
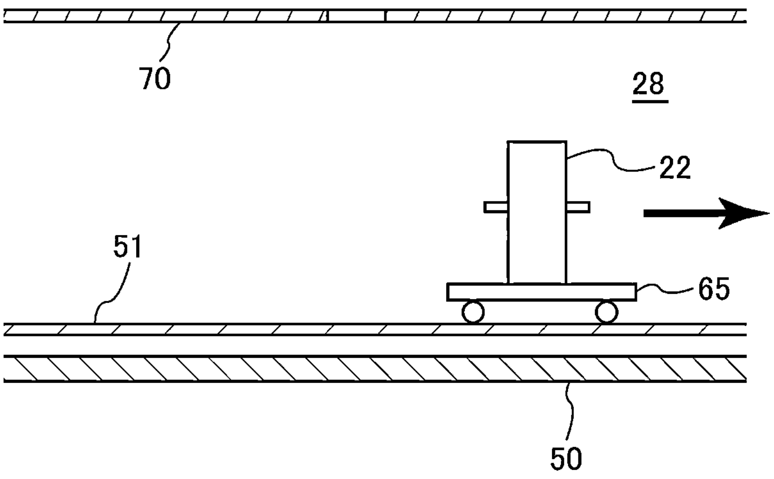
FIG. 5B is a schematic view showing a state in which the second transfer robot is being taken out of the substrate processing apparatus using the cart shown in FIG. 5A.

FIG. 5A is a schematic view showing a state in which a cart for taking the second transfer robot out of the substrate processing apparatus has been carried into the transfer area; and FIG. 5B is a schematic view showing a state in which the second transfer robot is being taken out of the substrate processing apparatus using the cart shown in FIG. 5A.

As shown in FIG. 5A, in the substrate processing apparatus that has the door 29 mentioned above and that the transfer area 28 extends along the longitudinal direction of the substrate processing apparatus 10, the door 29 is opened to easily carry the cart 65 into the transfer area 28 and move the cart 65 directly under the second transfer robot 22. When carrying the cart 65 into the substrate processing apparatus 10, it is necessary to remove the inclined plates 56 from the gutters 53 and 54 and carry the inclined plates 56 out of the substrate processing apparatus 10. However, if the transfer area 28 is designed in a straight line, removal work of the inclined plates 56 and carrying them out of the transfer area 28 are very easy.

The second transfer robot 22 shown in FIG. 5A is secured to a beam (or frame) 70 located near a ceiling of the substrate processing apparatus 10 using fasteners, such as bolts (not shown). In this embodiment, removal of the fasteners allows the second transfer robot 22 to be easily moved onto the cart 65 which has been moved directly under the second transfer robot 22. Furthermore, since the transfer area 28 extends along the longitudinal direction of the substrate processing apparatus 10, the second transfer robot 22 and the cart 65 can be carried out of the substrate processing apparatus without crashing against components of the substrate processing apparatus 10 (e.g., the partition walls 15, 16, and the gutter 53, 54).

In the embodiments described above, the substrate processing apparatus 10 has two polishing modules 21*a*, 21*b* as first processing module. However, the number of first processing module is not limited to this example. The substrate processing apparatus 10 only needs to have at least one first processing module. Similarly, the substrate processing apparatus 10 has one cleaning module 31 as the second processing module, but the number of second processing module is not limited to this example. The substrate processing apparatus 10 only needs to have at least one second processing module.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments.

Therefore, the present invention is not intended to be limited to the embodiments described herein but is to be accorded the widest scope as defined by limitation of the claims.

INDUSTRIAL APPLICABILITY

The present invention is applicable to a substrate processing apparatus for processing a substrate, such as a wafer.

REFERENCE SIGNS LIST

10 substrate processing apparatus
11 controller
20 polishing section
21A first polishing module (first processing module)
21B second polishing module (first processing module)
22 second transfer robot
28 transfer area
29 door
30 cleaning section
31 cleaning module (second processing module)
32 drying module
33 third transfer robot
34 fourth transfer robot
40 loading/unloading section
41 front loader
42 first transfer robot
50 base
51 floor
53,54 gutter
56 inclined plate
58 drain
59 sensor dog
60 sensor

The invention claimed is:

1. A substrate processing apparatus, comprising:
at least one first processing module configured to process a substrate using a liquid;
at least one second processing module configured to process the substrate that has been processed by the first processing module;
a transfer robot which is placed in a transfer area for transferring the substrate from the first processing module to the second processing module;
a pair of gutters which are disposed above a floor provided in the transfer area and coupled to drain lines; and
at least one inclined plate which is hung over the pair of gutters,
wherein an upper surface of the inclined plate extends from one of the pair of gutters to the other at an angle with respect to a horizontal direction.

2. The substrate processing apparatus according to claim 1, wherein at least a lower end of a partition wall for dividing the first processing module from the transfer area is located above one of the pair of gutters.

3. The substrate processing apparatus according to claim 1, wherein at least a lower end of a partition wall for dividing the second processing module from the transfer area is located above the other of the pair of gutters.

4. The substrate processing apparatus according to claim 1, further comprising: a sensor configured to detect whether or not the inclined plate is positioned correctly with respect to the pair of gutters.

5. The substrate processing apparatus according to claim 4, wherein the inclined plate has a sensor dog attached to a lower surface thereof, and
the sensor is a non-contact type detection-sensor or a contact type detection-sensor configured to detect the sensor dog.

6. The substrate processing apparatus according to claim 1, wherein the at least one inclined plate comprises a plurality of inclined plates which are arranged along a longitudinal direction of the substrate processing apparatus, and
the plurality of inclined plates are continuously arranged in the longitudinal direction of the substrate processing apparatus by overlapping front and rear ends of adjacent inclined plates in the longitudinal direction.

7. The substrate processing apparatus according to claim 1, further comprising: a door which is provided in a wall of the substrate processing apparatus and for access to the transfer area,
wherein the transfer area extends from the door along a longitudinal direction of the substrate processing apparatus, and in a straight line.

* * * * *